United States Patent [19]

O'Shaughnessy et al.

[11] Patent Number: 4,733,107
[45] Date of Patent: Mar. 22, 1988

[54] LOW CURRENT HIGH PRECISION CMOS SCHMITT TRIGGER CIRCUIT

[75] Inventors: Timothy G. O'Shaughnessy, Yorba Linda; Kenneth W. Ouyang, Huntington Beach, both of Calif.

[73] Assignee: Western Digital Corporation, Irvine, Calif.

[21] Appl. No.: 883,957

[22] Filed: Jul. 10, 1986

[51] Int. Cl.$^4$ .................. H03K 3/29; H03K 5/153
[52] U.S. Cl. ..................... 307/290; 307/354; 307/359
[58] Field of Search ............... 307/290, 359, 354, 360

[56] References Cited

U.S. PATENT DOCUMENTS 4,563,594  1/1986  Koyama ........................ 307/359

FOREIGN PATENT DOCUMENTS 0023022  3/1981  Japan ........................ 307/290

Primary Examiner—John Zazworsky
Assistant Examiner—M. R. Wambach
Attorney, Agent, or Firm—Spensley Horn Jubas & Lubitz

[57] ABSTRACT

A CMOS Schmitt Trigger circuit includes a differential structure for comparing an input signal with a feedback signal and a feedback circuit for providing the feedback signal with one of two voltage levels. A CMOS switch pair is connected to one or both of the differential structure and feedback circuit to provide power to the circuit only when necessary so as to minimize power consumption.

24 Claims, 14 Drawing Figures

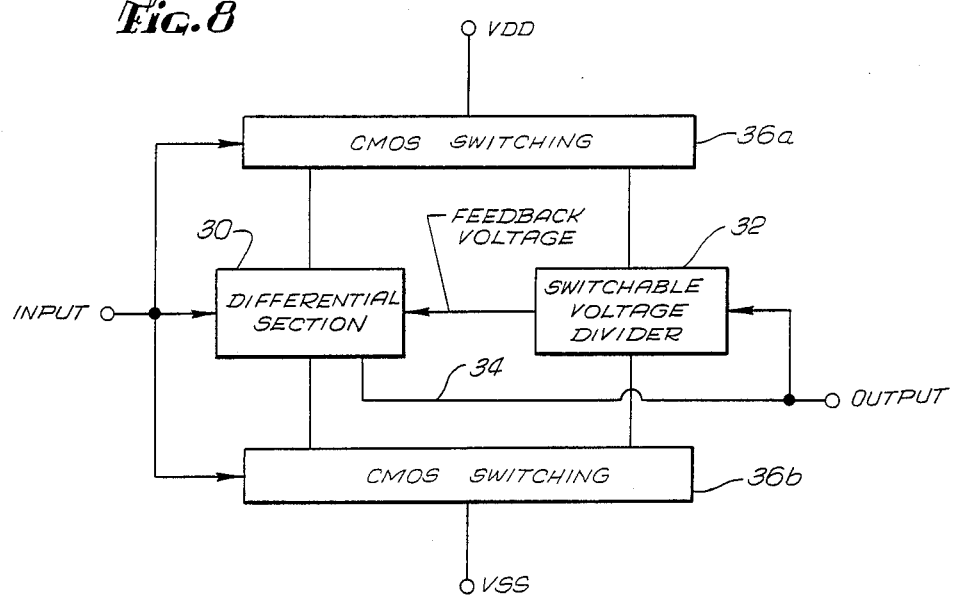
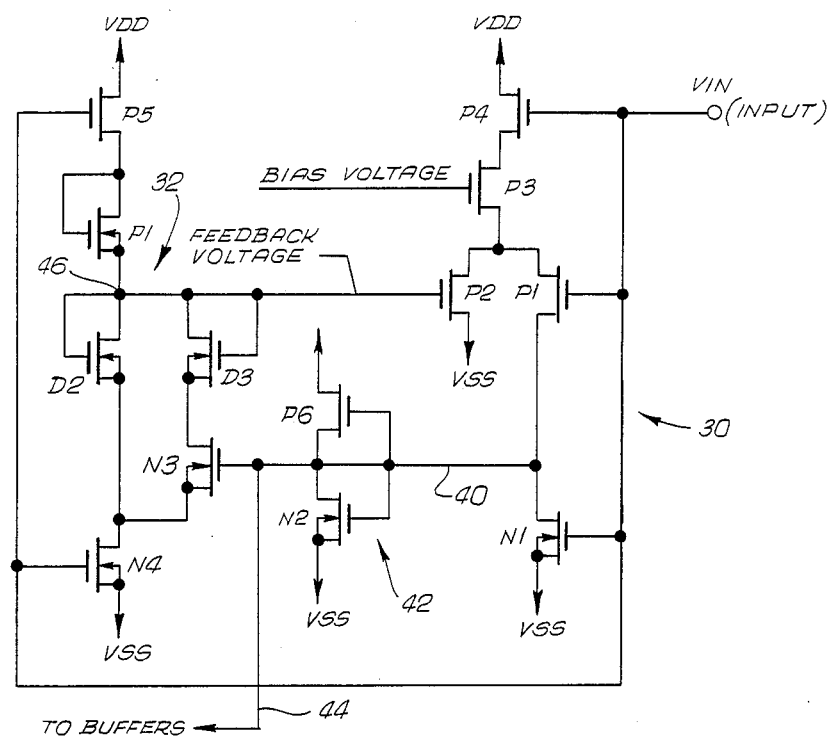

LOW CURRENT HIGH PRECISION CMOS SCHMITT TRIGGER CIRCUIT

BACKGROUND OF THE INVENTION

1. Field of the Invention

The present invention relates to Schmitt Trigger circuits and more particularly to Schmitt Trigger circuits utilizing CMOS (Complementary Metal Oxide Semiconductor) circuitry.

A Schmitt Trigger is a circuit that provides an output signal of either logic 0 or logic 1 in response to an input signal. When the input signal crosses a specified threshold voltage (or current), the output changes to the other logic condition. When the logic condition changes on the output, the threshold voltage is also changed. The difference in threshold voltages is called hysteresis.

The basic operation of a Schmitt Trigger is illustrated in FIG. 1. Initially, the output is at logic 0. When the input voltage increases to a high switching threshold voltage VTH+, the output will change states to logic 1. Upon this change, the switching threshold of the Schmitt Trigger circuit will be changed from VTH+ to a lower threshold VTH−. Therefore, in order to switch back to a logic 0 output, the input voltage must fall below the lower threshold VTH−.

There are at least two applications of the Schmitt Trigger. First, when properly used the Schmitt Trigger reduces errors in digital systems due to noise in the input signal. The reduction in errors occurs because once the output has switched and the threshold voltage changed, the input voltage must cross both threshold voltages to produce a logic change on the output. If the magnitude of the noise is less than the hysteresis of the Schmitt Trigger, then the circuit will not respond to the noise. This is illustrated in FIGS. 2a and 2b.

In a second application, the Schmitt Trigger provides a fast transition on the output, even to slow changes on the input. Therefore, the circuit is useful in waveform generation, such as sine wave to square wave converters, and for pulse generation.

2. Description of the Prior Art

CMOS circuits have been used in the past to fabricate Schmitt Triggers. Two general techniques have been employed. The first technique provides circuits that require a very small power supply current. The circuit includes an input stage including a CMOS inverter (i.e., an N channel and P channel transistor with their gates connected together and their drains connected together) and a diode connected MOS transistor. The diode increases the switching threshold voltage of the input inverter for the high switching threshold VTH+, and the diode is shorted to obtain VTH−. The primary disadvantage of such a circuit is that both the low threshold voltage VTH− and the hysteresis are established by process parameters of the N channel and P channel transistors of the CMOS inverter. The combined effects of temperature and process variations produce very large variations in the switching thresholds.

A second type of CMOS Schmitt Trigger circuit employs a circuit having a differential input section (comparator) such as shown in FIG. 3. The differential section includes transistors 10 and 12 having the same conductivity type, with the transistor 10 receiving the input signal at its gate and the transistor 12 receiving a feedback voltage equal to either the low threshold voltage or high threshold voltage at its gate. The drain of the transistor 12 is the output terminal of the circuit. The output drives a switchable voltage divider 14 to provide the proper threshold voltage to the gate of the transistor 12. Because the elements of the differential pair both have the same process parameters, the switching threshold voltages exhibit less sensitivity to process and temperature.

Although the circuit of FIG. 3 is able to provide precise threshold voltages, the differential pair and the voltage divider require a current source. This is provided in the circuit shown in FIG. 3 by bias transistors 16 and 18, each of which is independently biased to provide the necessary current from the power supply VDD. Thus, precision is obtained at the expense of relatively high power requirements.

SUMMARY OF THE INVENTION

The present invention is directed to a CMOS Schmitt Trigger circuit which achieves high precision in the threshold voltages while requiring very little current. This is accomplished by employing a circuit including a differential pair and a feedback circuit having a switchable voltage divider and providing CMOS switching elements controlled by the input signal to provide power to the differential pair and voltage divider only when necessary. At other times, the CMOS switching elements prevent current from being drawn from the power supply, thus minimizing power consumption by the circuit.

BRIEF DESCRIPTION OF THE DRAWINGS

The invention will be described with reference to the accompanying drawings wherein:

FIG. 8 is a block diagram of the Schmitt Trigger circuit of the present invention; and FIGS. 9–13 are schematic diagrams of various embodiments of the Schmitt Trigger circuit of the present invention.

DESCRIPTION OF THE PREFERRED EMBODIMENTS

The following description is of the best presently contemplated mode of carrying out the invention. This description is made for the purpose of illustrating the general principles of the invention and is not to be taken in a limiting sense. The scope of the invention is best determined by reference to the appended claims.

Figure 1:
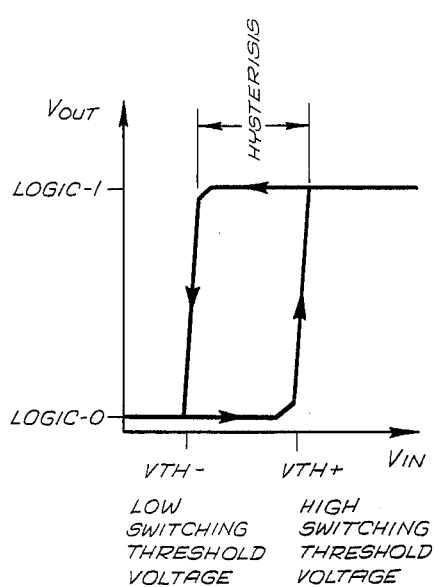
FIG. 1 is a diagram of the transfer characteristic of a Schmitt Trigger circuit.
Figure 2A:
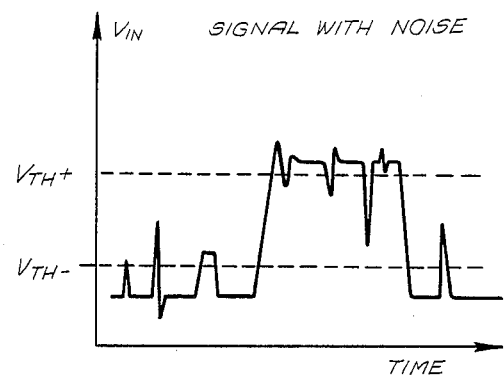
FIGS. 2a and 2b are waveforms showing the input and output of a Schmitt Trigger circuit with respect to time.
Figure 2B:
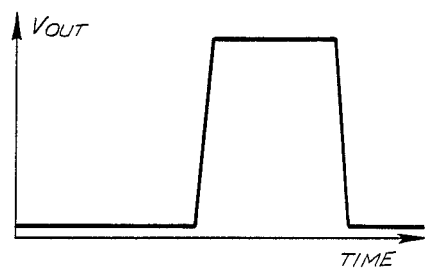
Figure 3:
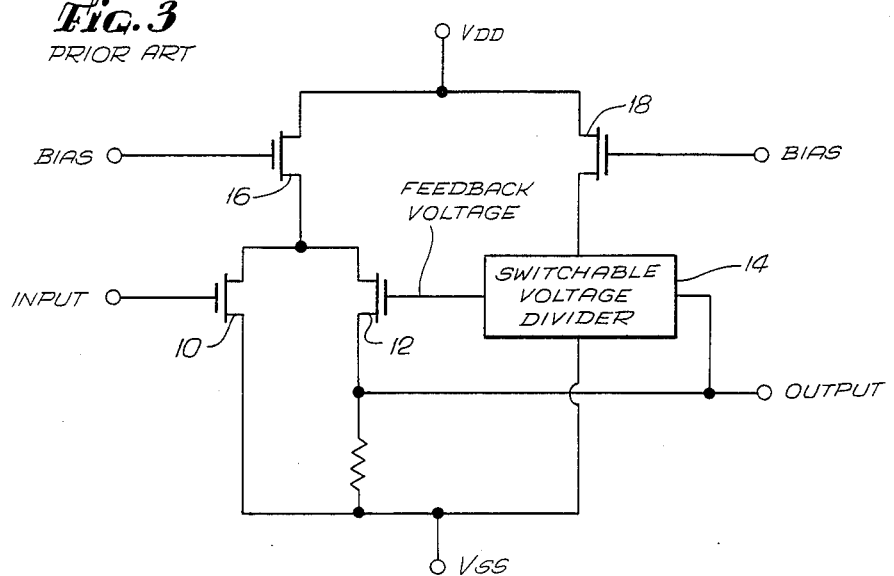
FIG. 3 is a partial schematic, partial block diagram of a prior art Schmitt Trigger circuit.
Figure 4:
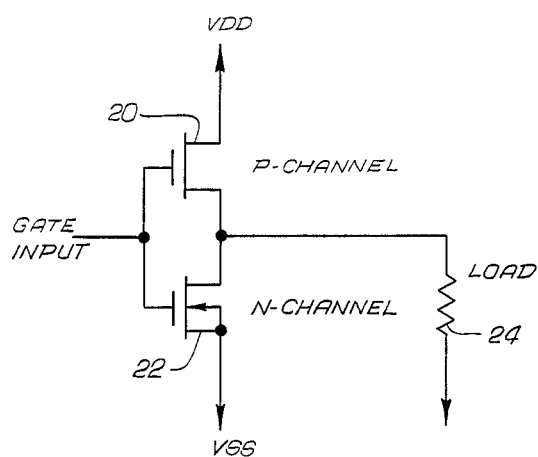
FIG. 4 is a schematic diagram of a CMOS inverter circuit.
Figure 5:
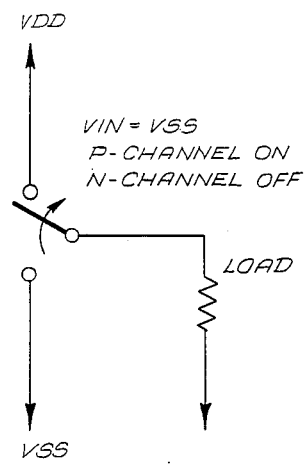
FIG. 5 is a diagram of the switching action provided by the circuit of FIG. 4.

The present invention makes use of a CMOS pair of transistors to function as a switch to control the application of power to a Schmitt Trigger circuit. To aid in the understanding of the invention, the switching function which can be provided by a CMOS pair will be described. As illustrated in FIG. 4, a CMOS inverter includes a P channel transistor 20 having its source connected to a positive power supply (by convention called VDD) and an N channel transistor 22 having its source connected to a negative power supply (VSS). Both gates of the transistors are connected to receive an input signal. If the input gate voltage approaches VSS, the P channel transistor turns on and the N channel transistor turns off. The output node and load 24 effectively is connected to VDD through the low channel resistance of the P channel transistor 20. Similarly, if the input voltage approaches VDD, the N channel transistor turns on and the output effectively is connected to VSS. The inverter thus acts as a SPDT (single pole double throw) switch connecting the output to either VDD or VSS. This operation is illustrated in FIG. 5.

Figure 6:
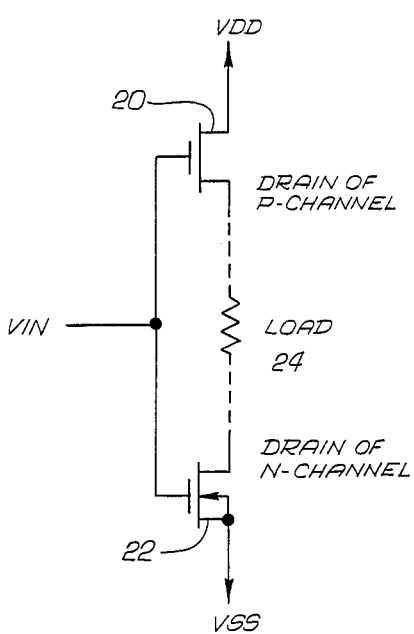
FIG. 6 is a schematic diagram of a CMOS inverter circuit having a load connected between the drains of the transistors of the circuit.
Figure 7:
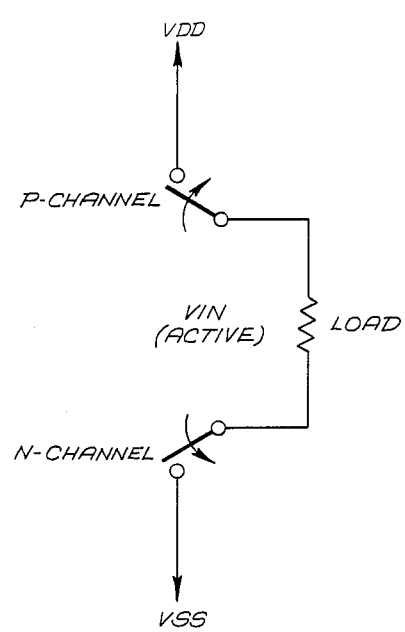
FIG. 7 is a diagram showing the switching action of the circuit of FIG. 6.

FIG. 6 illustrates an arrangement in which the drains of the two transistors are disconnected and reconnected to the load element 24. In this instance, the load element will have one node connected to VDD if the input gate voltage approaches VSS. Similarly, the load element will have the other node connected to VSS if the input gate voltage approaches VDD. The N and P channel transistors act as a DPST (double pole single throw) switch, as illustrated in FIG. 7.

If the input gate voltage is between VSS and VDD such that both the N and P channel transistors are on, the switch element effectively connects the load across the power supply terminals. The switch element is used in this fashion in the present invention to provide current to the differential structure. This current will be provided when the input signal is greater than VSS plus the threshold voltage of the N channel transistor or less than VDD minus the value of the threshold voltage of the P channel transistor. In a similar fashion, a CMOS switch element connects power to the feedback circuitry including a switchable voltage divider under the same conditions. If the input signal approaches VSS or VDD such that either the N channel or P channel elements are off, the circuit requires no current from the power supply, thus greatly reducing power consumption.

FIG. 8 illustrates the general configuration of the Schmitt Trigger circuit of the present invention. The circuit includes a differential comparator section 30 which receives as comparison inputs an input signal and a feedback voltage from a feedback circuit including a switchable voltage divider 32 which provides one of two threshold voltages. The threshold voltage provided by the voltage divider 32 is controlled by the output of the differential section 30 on line 34. The provision of power to both the differential section and feedback circuit is controlled by a CMOS switching circuit 36 which includes portions 36a and 36b connected between the supply voltages VDD and VSS and the differential section and feedback circuit. The switching circuits are controlled by the input signal so as to provide power to the differential section and voltage divider when needed. At other times, the switches are open so as to minimize power requirements.

FIG. 9 illustrates one specific embodiment of the present invention. The device includes a differential comparator structure including P type transistors P1, P2 and P3 connected to the two drains of a CMOS switch element including transistors N1 and P4. The sources of the transistors N1 and P4 are connected to the power supplies VSS and VDD, respectively. The input signal VIN is connected to the gate inputs of the transistors N1 and P4 of the CMOS switch and to one gate input (P1) of the differential pair. When VIN approaches either VDD or VSS, one side of the differential switch will be off (as discussed above with respect to FIG. 7), and the differential structure will therefore draw no current from the power supply. However, if the input voltage is between VSS and VDD such that both sides of the CMOS switch conduct current, then the current element (P3) of the differential structure draws current as set by a bias voltage applied to its gate.

The basic requirement for both of the transistors N1 and P4 of the CMOS switch to be on are that VIN must be greater than VSS plus the threshold voltage of N1 and VIN must be less than VDD minus the threshold voltage of P4. Thus, in order for the differential structure to draw current the following relationship must be satisfied:

$$VSS + |VTN1| < VIN < VDD - |VTP4|$$

where VTP4 and VTN1 are the threshold voltages of the transistors P4 and N1, respectively. When this relationship is satisfied, both sides of the CMOS switch element are on and VIN is considered "ACTIVE".

When VIN is active, the differential structure has a switching threshold determined by the feedback voltage applied to the gate of the transistor P2. The feedback voltage is at one of two values and is controlled by the output of the differential structure on line 40 via an inverter 42 which includes transistors N2 and P6. On the other hand, if VIN approaches VSS it will fall out of the active region and, the N channel switch element N1 will be off, which provides the correct logic condition (logic 1) to the gate input of the inverter 42. Similarly, if VIN approaches VDD, the P channel switch element P4 is off (N1 is on), which also provides the correct logic condition (logic 0) to the inverter 42. The output of the inverter 42 on line 44 is the output of the Schmitt Trigger circuit which may be provided to buffers so as to provide inverted and noninverted buffered output signals.

The output of the inverter also controls the feedback circuit including the switchable voltage divider 32. As is the case with the differential structure, the feedback circuit includes a CMOS switch element (transistors P5 and N4) that provides power to the feedback network when VIN is in the active range. The feedback circuit is basically comprised of a switchable voltage divider including diode connected transistors D1, D2 and D3 (i.e., transistors having their gates and drains interconnected so as to function as diodes) and control transistor N3. The transistors D1 and D2 are series connected between the drains of N4 and P5, and the transistor D3 is series connected with the control transistor N3, both of which elements are connected in parallel with the transistor D2. The elements D1 and D2 form a voltage divider network, with the element D3 being switchable into and out of the network by means of the control transistor N3 so as to voltage at point 46, which is the feedback voltage applied to the gate of the transistor P2. The switching of the control transistor N3 is controlled by means of the output of the inverter 42 so that the desired feedback voltage (corresponding to the low threshold or high threshold) is provided.

When VIN is active, the transistors N4 and P5 are conductive and power will be supplied to the feedback circuit. The width to length ratio of the channels of the transistors P5 and N4 are large enough so that their ON resistance is low, and the feedback circuit will provide one of two predetermined feedback voltages at 46 depending upon whether or not the control transistor N3 is on to connect the transistor D3 in parallel with the transistor D2. Thus, the feedback voltage will be applied to the transistor P2 of the differential structure to achieve proper Schmitt Trigger operation.

Proper operation is maintained when the input signal is outside of the active range. If VIN approaches VSS, the N channel element N4 is off and the feedback voltage at point 46 will rise above the designed value for the high switching threshold voltage. However, the higher value of the feedback voltage at this time maintains the correct logic condition on the output of the Schmitt Trigger at 44. Likewise, if VIN approaches VDD, the P channel switch element P5 is off and the feedback voltage at point 46 falls below the designed value for the low switching threshold voltage. Again, however, the lower value of the feedback voltage maintains the correct logic condition on the Schmitt Trigger output. In general, since VIN of the Schmitt Trigger must cross both threshold voltages for a valid logic transition, adequate time and voltage margins exist in the circuit to establish the proper logic response. Furthermore, since the feedback voltage establishes higher and lower voltages when the circuit is outside of the active range, the circuit should provide even more immunity to both internal and external noise than prior circuits incorporating a differential structure.

Thus, the invention provides a Schmitt Trigger circuit incorporating a differential structure and a feedback circuit with a switchable voltage divider. Both the differential structure and the feedback circuit are provided with CMOS switch elements to control the application of power to the circuits, with power being provided only when the input signal is within an active range which includes the high and low threshold voltages provided by the feedback network. At other times, current is not supplied to the differential structure or the feedback network, but the circuit functions to maintain the output of the Schmitt Trigger in its proper logic condition. The circuit thus combines high precision Schmitt Trigger operation with low power consumption.

Figure 10:
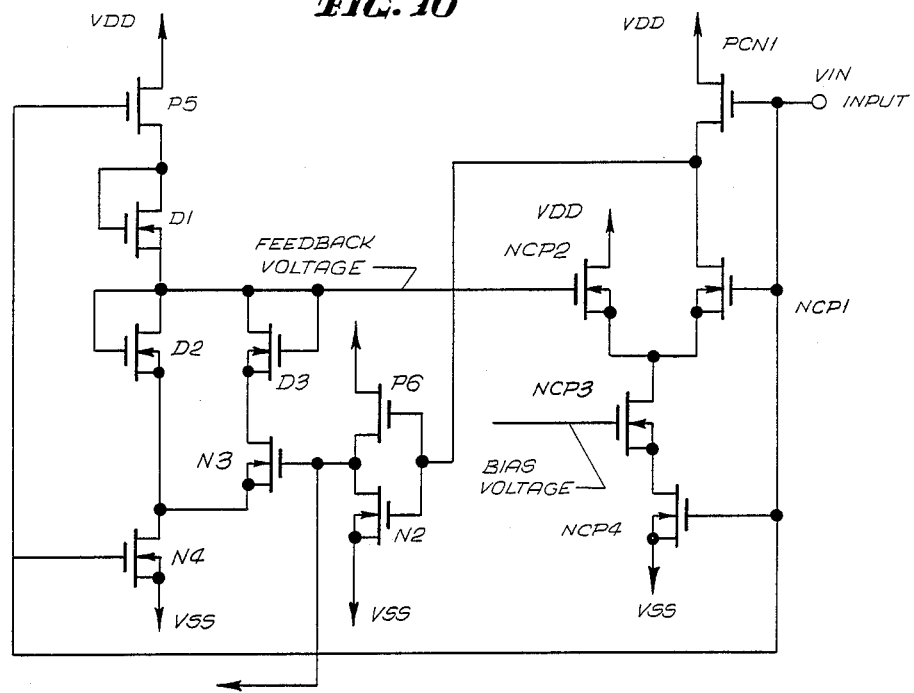

FIGS. 10 through 13 illustrate several circuit variations in the present invention. FIG. 10 is identical to FIG. 9 except that it incorporates an N channel differential structure as opposed to a P channel differential structure. In this circuit, the transistors NCP1, NCP2, NCP3, NCP4 and PCN1 correspond to the opposite conductivity transistors, P1, P2, P3, P4 and N1, respectively of the circuit of FIG. 9.

Figure 11:
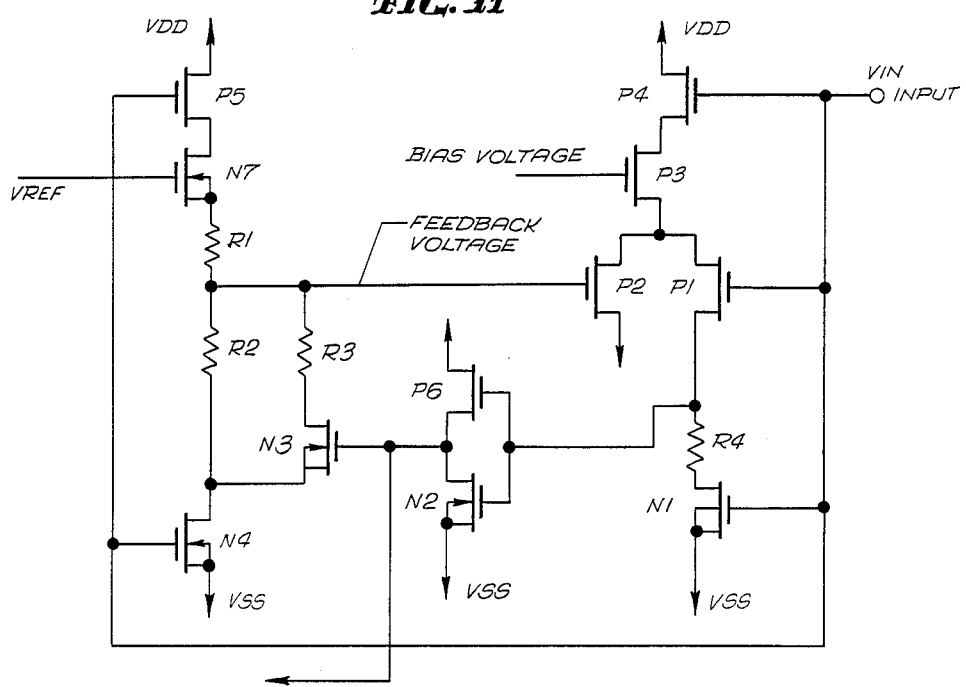

FIG. 11 illustrates a circuit in which the diode connected MOS transistors of the feedback circuit have been replaced by a switch resistor divider including resistors R1, R2 and R3. Optionally, an additional resistor R4 may be connected between the transistors P1 and N1 to improve accuracy in the switching at the threshold voltages. The actual threshold of the feedback circuit may also be improved by providing a source follower transistor N7 driven by a reference voltage. Either one or both of the transistor N7 and resistor R4 may be provided in the circuit.

Figure 12:
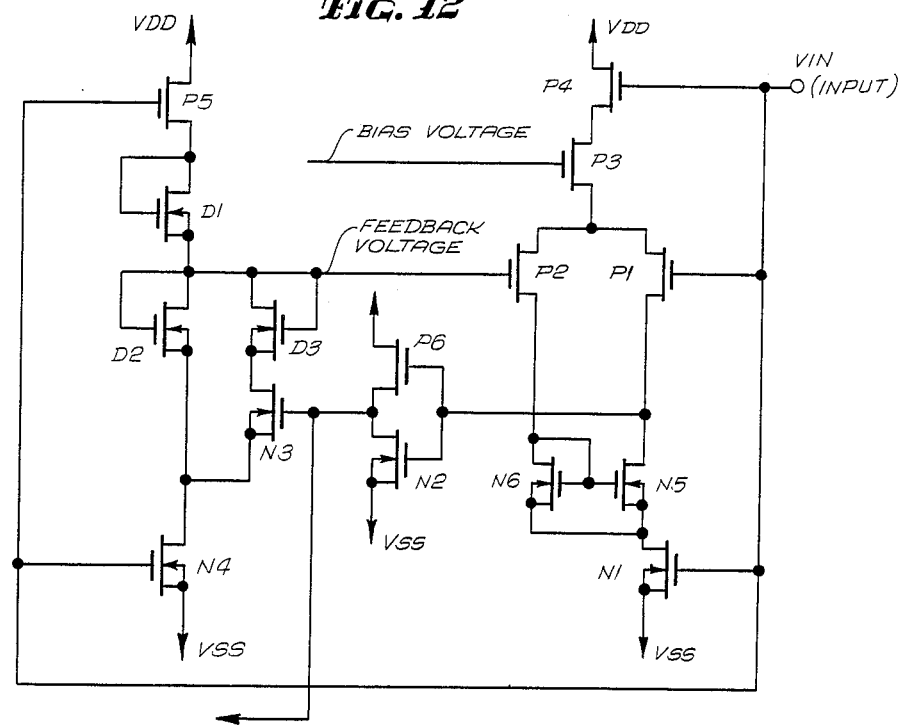

In FIG. 12, a current mirror arrangement including transistors N5 and N6 having their drains connected to the drains of transistors P1 and P2, respectively, and their sources connected to the drain of transistor N1 is also added to improve the accuracy of the switching at the threshold voltages.

Figure 13:
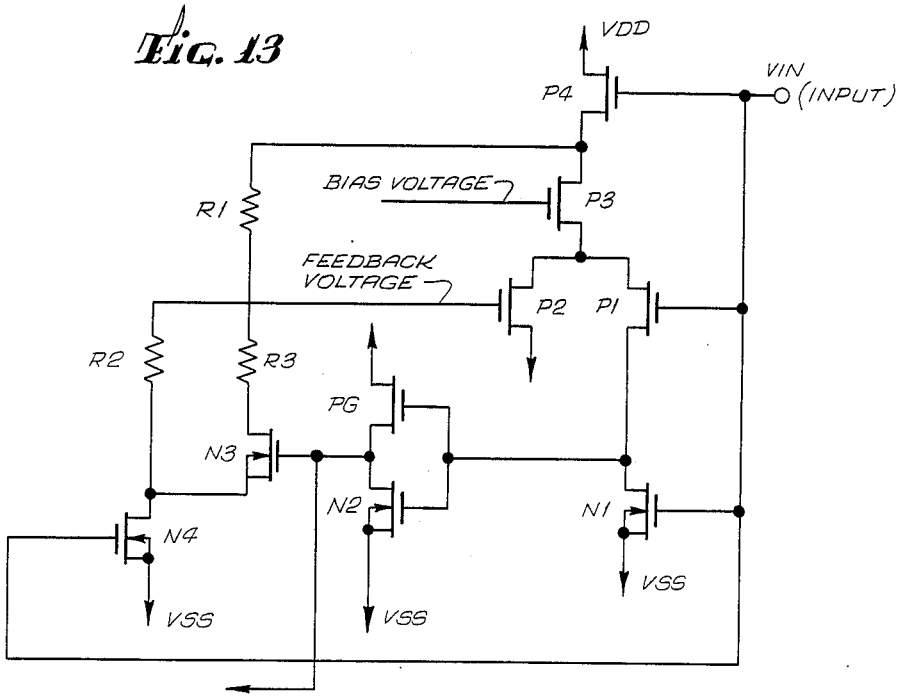

In FIG. 13, the transistor P4 is used as part of the CMOS switch element for both the differential structure and the feedback circuit by providing the connection between the drain of P4 and the resistor R1. In general, any of the CMOS switch elements may be combined to reduce interconnect parasitics or to reduce the number of transistors required in the circuit.

Many variations of the above described circuits may be implemented. In general, the invention is directed to a Schmitt Trigger circuit which incorporates a differential structure and includes a combination of N channel and P channel transistors functioning as a switch to reduce the power supply current required by the structure. Similarly, power supply current requirements are reduced by providing a combination on N channel and P channel transistors connected to the feedback circuit of the Schmitt Trigger. The feedback circuit may contain resistors, diodes, MOS or bipolar transistors, or other elements to achieve the desired accuracy in the threshold voltages.

What is claimed is:

1. A Schmitt Trigger circuit comprising:
   a differential comparator having a first input for receiving an input signal, a second input for receiving a comparison signal to be compared to the input signal, an output switchable from a first output state to a second output state, and power supply terminals for the application of current from a power supply to the comparator;
   feedback means, coupled to the second input, for providing one of a predetermined first and second voltages as the comparison signal in accordance with the output state of the comparator, said feedback means including power supply terminals for the application of current from the power supply to the feedback means; and
   switch means, coupled to at least one of the power supply terminals of the comparator and feedback means and controlled by the input signal, for controlling the application of current from the power supply to at least one of the comparator and feedback means.

2. A circuit as in claim 1 wherein the input voltage controls the application of current to both the comparator and the feedback means.

3. A circuit as in claim 1 wherein the comparator includes first and second supply terminals and the switch means includes a first MOS transitor of first conductivity type having its gate connected to receive the input signal, its source disposed for connection to a first power supply and its drain operatively coupled to the first supply terminal, and a second transistor of second conductivity type having its gate connected to receive the input signal, its source disposed for connection to a second power supply and its drain operatively coupled to the second supply terminal.

4. A circuit as in claim 2 wherein the comparator includes first and second supply terminals, the feedback means includes third and fourth supply terminals and the switch means includes a first transistor of first conductivity type having its gate connected to receive the input signal, its source disposed for connection to a first power supply and its drain operatively coupled to the first supply terminal, a second transistor of second conductivity type having its gate connected to receive the input signal, its source disposed for connection to a second power supply and its drain operatively coupled to the second supply terminal, a third transistor of first conductivity type having its gate connected to receive the input signal, its source disposed for connection to the first power supply and its drain operatively coupled to the third supply terminal, and a fourth transistor of second conductivity type having its gate connected to receive the input signal, its source disposed for connection to the second power supply and its drain operatively coupled to the fourth supply terminal.

5. A circuit as in claim 4 wherein the comparator includes a pair of MOS transistors of the same conductivity type having their sources interconnected and connected to receive current from the first supply terminal, wherein the gate of one transistor is the first input and the gate of the other transistor is the second input, wherein the drain of one of the transistors is the output of the comparator.

6. A circuit as in claim 5 including an inverter having an input connected to the output of the comparator, wherein the feedback means includes a switchable voltage divider driven by the output of the inverter, wherein when the output of the inverter is at a high level the voltage divider provides the first voltage and when the output of the inverter is at a low level the voltage divider provides the second voltage.

7. A circuit as in claim 6 wherein the voltage divider includes a control transistor driven by the output of the inverter, first and second voltage dividing elements connected in series between the drains of the third and fourth transistors, the connection point of the voltage dividing elements being the output of the feedback means, a third voltage dividing element connected in series with the control transistor, wherein the third voltage dividing element and control transistor are connected in parallel with the second voltage dividing element, wherein the control transistor is rendered conductive or non-conductive by the output of the inverter to determine the value of the output of the feedback means.

8. A circuit as in claim 7 wherein the voltage dividing elements are resistors.

9. A circuit as in claim 7 wherein the voltage dividing elements are diode connected MOS transistors.

10. A Schmitt Trigger circuit comprising:
a differential section including first and second MOS transistors having their sources interconnected and an output at the drain of one of the transistors, an input terminal connected to the gate of the first transistor for receiving an input signal, and a feedback terminal connected to the gate of the second transistor for receiving a feedback signal, wherein the output will be a first level when the input signal is greater than the feedback signal and a second level when the input signal is less than the feedback signal;
a feedback section, coupled to the feedback terminal and controlled by the output of the differential section, for providing one of a predetermined first and second signals as the feedback signal;
a power supply terminal for supplying power to at least one of the differential section and feedback section; and
CMOS switch means, connected to the power supply terminal and controlled by the input signal, for controlling the application of power to at least one of the differential section and the feedback section.

11. A circuit as in claim 10 wherein the switch means includes:

a third transistor of first conductivity type having its gate connected to receive the input signal, its source disposed for connection to a first power supply and its drain connected to supply current to the interconnected sources of the first and second transistors; and
a fourth transistor of second conductivity type having its gate connected to receive the input signal, its source disposed for connection to a second power supply and its drain operatively coupled to the drain of at least one of the first and second transistors, wherein the third and fourth transistors are both rendered conductive within a voltage range of the input signal that includes the first and second feedback signals.

12. A circuit as in claim 11 including a CMOS inverter having an input connected to the output of the differential section, wherein the output of the inverter controls the feedback section.

13. A circuit as in claim 11 wherein the feedback section includes a switchable voltage divider for providing one of the first and second feedback signals at the feedback terminal.

14. A circuit as in claim 13 wherein the feedback section includes a pair of power supply terminals, connected to the switch means, through which power is supplied to the feedback section.

15. A circuit as in claim 14 wherein the voltage divider includes:
first and second voltage dividing elements connected in series between the feedback section power supply terminals, wherein the point between the voltage dividing elements is connected to the feedback terminal;
a third voltage dividing element; and
a MOS transistor switch controlled by the output of the differential section and connected in series with the third voltage dividing element, wherein the transistor switch and third voltage dividing element are connected in parallel with the second voltage dividing element.

16. A circuit as in claim 15 wherein the voltage dividing elements are resistors.

17. A circuit as in claim 15 wherein the voltage dividing elements are diode connected transistors.

18. A circuit as in claim 11 wherein the differential section includes a current source MOS transistor, driven by a bias voltage, having one of its drain and source connected to the drain of the third transistor and the other of its drain and source connected to the interconnected sources of the first and second transistors.

19. A circuit as in claim 18 wherein the feedback section includes first and second power supply terminals through which power is supplied to the feedback section, and wherein the third transistor is operatively coupled to the first power supply terminal, the switch means further including a fifth transistor of second conductivity type having its gate connected to receive the input signal, its source disposed for connection to the second power supply and its drain connected to the second supply terminal of the feedback means.

20. A circuit as in claim 18 wherein the feedback section includes first and second power supply terminals through which power is supplied to the feedback circuit, wherein the switch means further includes:
a fifth transistor of first conductivity type having its gate connected to receive the input signal, its source disposed for connection to the first power supply and its drain operatively coupled to the first power supply terminal; and a sixth transistor having its gate connected to receive the input signal, its source disposed for connection to the second power supply and its drain operatively coupled to the second power supply terminal.

21. A circuit as in claim 20 further including a seventh MOS transistor having one of its source and drain connected to the drain of the fifth transistor, the other of the source and drain connected to the first power supply terminal, and its gate connected to receive a reference voltage, said seventh transistor providing a precise current to the feedback means.

22. A circuit as in claim 11 further including a resistor connected between the drains of the second transistors.

23. A circuit as in claim 11 further including a pair of current mirror connected MOS transistors, the drain of one of the transistors connected to the drain of the first transistor and the drain of the other of the transistors connected to the drain of the second transistor, the sources of the current mirror transistors being connected to the drain of the fourth transistor.

24. A CMOS Schmitt Trigger circuit comprising:

power supply means for supplying power to the circuit, said power supply means having first and second power supply terminals;

a differential comparator section, coupled to receive power from the first power supply terminal, including first and second MOS transistors having their sources interconnected and an output at the drain of one of the transistors, an input terminal connected to the gate of the first transistor for receiving an input signal, and a feedback terminal connected to the gate of the second transistor for receiving a feedback signal, wherein the output will be a first level when the input signal is greater than the feedback signal and a second level when the input signal is less than the feedback signal;

a feedback section, coupled to receive power from the second power supply terminal and to be controlled by the output of the differential section, for providing to the feedback terminal one of a predetermined first and second feedback voltages as the feedback signal; and CMOS switch means, including at least a third MOS transistor connected to the first power supply terminal and controlled by the input signal and a fourth MOS transistor connected to the second power supply terminal and controlled by the input signal, for controlling the application of power to the differential section and the feedback section, said third and fourth transistors being rendered simultaneously conductive for a range of input signal values that includes the first and second feedback volages.

* * * * *